(12) United States Patent
Shenoy et al.

(10) Patent No.: US 12,736,603 B2
(45) Date of Patent: Sep. 15, 2026

(54) COMPUTING DEVICE CURRENT SENSOR CALIBRATION TRIGGER

(71) Applicant: QUALCOMM Incorporated, San Diego, CA (US)

(72) Inventors: Suresh Shenoy, San Diego, CA (US); Krishna Sai Anirudh Katamreddy, San Diego, CA (US); Farhad Ehya, San Diego, CA (US); Joseph Terregrossa, Vista, CA (US)

(73) Assignee: QUALCOMM Incorporated, San Diego, CA (US)

( * ) Notice: Subject to any disclaimer, the term of this patent is extended or adjusted under 35 U.S.C. 154(b) by 525 days.

(21) Appl. No.: 18/187,977

(22) Filed: Mar. 22, 2023

(65) Prior Publication Data

US 2024/0319306 A1 Sep. 26, 2024

(51) Int. Cl.

*G01R 35/00* (2006.01)
*G01K 3/00* (2006.01)
*G01R 19/165* (2006.01)

(52) U.S. Cl.

CPC ........... *G01R 35/005* (2013.01); *G01K 3/005* (2013.01); *G01R 19/16576* (2013.01)

(58) Field of Classification Search

CPC ................ G01R 19/0092; G01R 19/25; G01R 33/0017; G01R 33/0035; G01R 33/02; H01H 9/54; H02H 7/20; H02H 3/085

See application file for complete search history.

(56) References Cited

U.S. PATENT DOCUMENTS 9,552,034 B2 1/2017 Yeager
9,804,622 B2 * 10/2017 Berard .................... H02J 9/062
2011/0208471 A1 * 8/2011 Lee ........................ G01K 7/186
702/124
2016/0070327 A1 3/2016 Nemani et al.
2020/0342749 A1 * 10/2020 Malhan ................ G01D 18/008
2022/0326090 A1 * 10/2022 Cirit ......................... G01K 7/01

FOREIGN PATENT DOCUMENTS

WO 2016028639 A1 2/2016

* cited by examiner

*Primary Examiner* — Bryan R Perez
(74) *Attorney, Agent, or Firm* — Loza & Loza, LLP

(57) ABSTRACT

Aspects relate to a calibration trigger for a current sensor of a computing device. In one example, a current sensor controller is configured to receive a temperature signal representing a measured temperature of a computing device. A comparator is configured to determine if the temperature signal exceeds a temperature threshold. A logic gate is configured to trigger a calibration of a current sensor coupled to the computing device in response to the temperature true signal exceeding the threshold.

23 Claims, 5 Drawing Sheets

COMPUTING DEVICE CURRENT SENSOR CALIBRATION TRIGGER

TECHNICAL FIELD

Aspects of the present disclosure relate generally to power distribution networks for powering computing devices and, in particular, to triggering a calibration of a current sensor for such a power distribution network in response to voltage and temperature.

BACKGROUND

Some mobile and stationary computing devices use high performance capabilities only intermittently. In order to reduce costs, devices are optimized for a medium level of performance with an ability for intermittent periods of peak performance. One form of active peak power management uses a current sensor to detect peak power events and then send information to a downstream control loop. The downstream control loop monitors for excess power or current drain and then reduces the power from the peak power to a lower power when necessary. This prevents the computing device from breaching current limits or overheating and allows the computing device to operate at a higher power for brief periods that are determined based on the actual conditions of the device. In a very cold ambient environment, the peak performance period may be much longer than in a very hot ambient environment. With recent low usage the peak performance period may be much longer than after the device has just been used heavily. The downstream control loop may also respond differently to different types of computing that may place different kinds of demands on the device.

To maintain accurate peak power management, the current sensor is periodically calibrated. This is referred to as trimming and is used, in part, to compensate for input referred offset as part of an overall calibration. The offset and other errors can increase over time due to temperature and/or voltage changes, which can cause wear on components of the computing device. The current sensor may be trimmed by software routines, and on a regular schedule, e.g., every second, or in response to particular events, such as a wake or a power on. The software trimming instructions may be part of a power management software call stack. When the software instructions are called, e.g., based on a timer, the current sensor is taken offline, measurements of the performance of the sensor are made, and new offset values are written into trim registers.

The current sensor is offline while the trim is in progress, which shuts off the active peak power management. In order to keep the computing device operating within default safe parameters, the software may also reduce the performance of the computing device during the trim in order to meet the power supply current limit specification. In some implementations, the software applies a constant current throttle to ensure that the computing device stays within current limits.

BRIEF SUMMARY

The following presents a summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

In one example, a current sensor controller is configured to receive a temperature signal representing a measured temperature of a computing device. A comparator is configured to determine if the temperature signal exceeds a temperature threshold. A logic gate is configured to trigger a calibration of a current sensor coupled to the computing device in response to the temperature signal exceeding the temperature threshold.

Another example provides a method that includes receiving a temperature signal at a current sensor controller, the temperature signal representing a measured temperature of a computing device, determining if the temperature signal exceeds a temperature threshold, and triggering a calibration of a current sensor coupled to the computing device in response to the temperature signal exceeding the temperature threshold.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Temperature and voltage sensor hardware blocks may be coupled to a current sensor controller through respective side-band interfaces. The current sensor controller receives temperature and voltage inputs directly from the hardware blocks and applies the temperature and voltage inputs to configurable temperature and voltage thresholds or cross-over points. The cross-over points are used as triggers to start a trimming operation. The current sensor controller can then transmit a configurable default current value to mitigate for any peak power events while the calibration is in progress. The current sensor controller can then also perform the trimming operation.

A software-driven trimming operation is performed while a power management processor is active and may consume processor resources that might otherwise be used for other instructions. The software-driven trimming operation also causes the power to be throttled during the trimming operation. By using temperature and voltage sensors instead to trigger the trimming operation, trimming is avoided when it is not needed. This reduces demands on the power management processor and reduces restrictions on the power. By using hardware to trigger and even to perform the trimming, the trimming is performed faster and does not cause latency for software operations.

Figure 1:
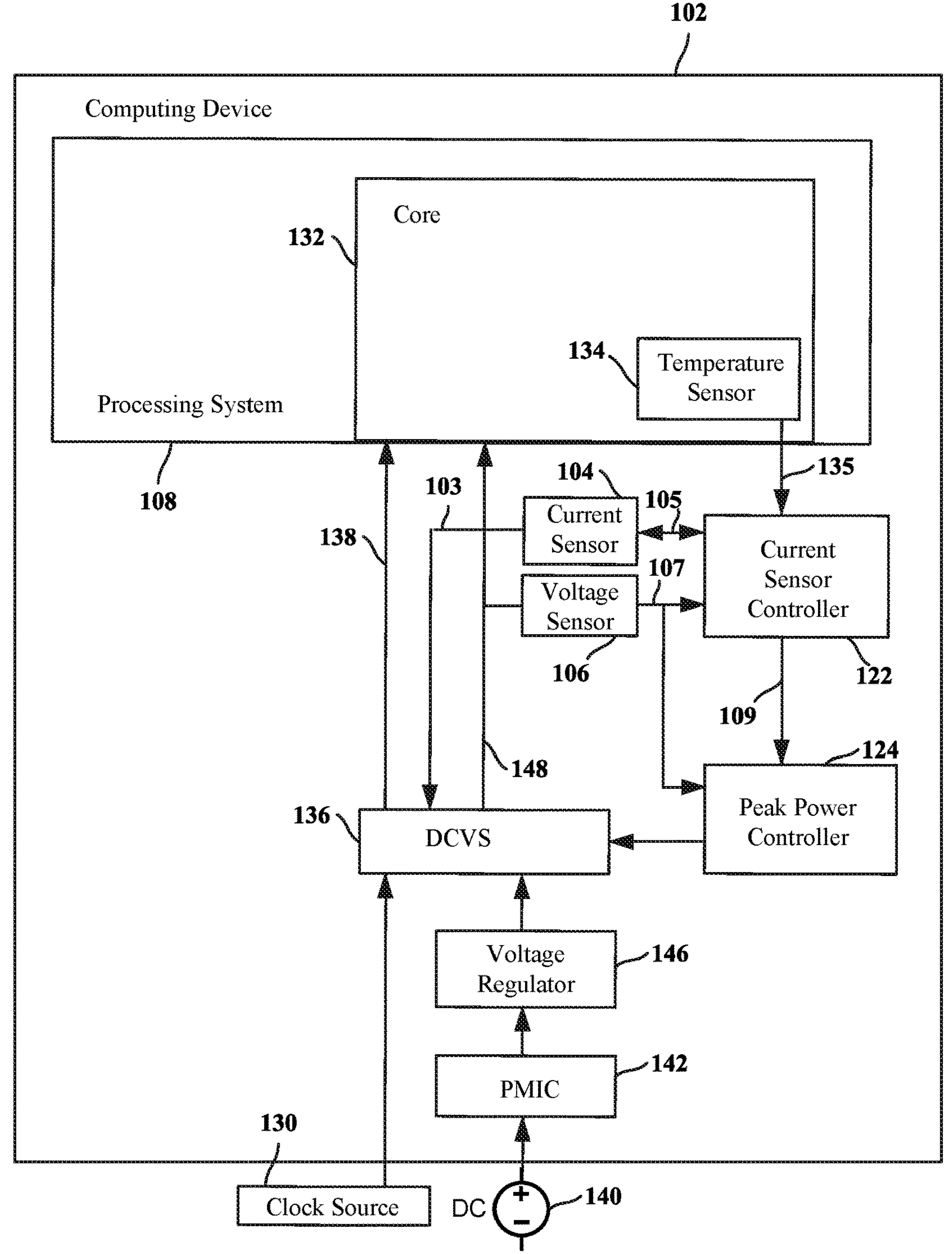
FIG. 1 illustrates a block diagram of a computing device with a processing system and current sensor, in accordance with certain aspects of the disclosure.

FIG. 1 shows components of a computing device 102 with a processing system 108 and a current sensor 104. Modern processing systems includes cores that often have workloads that vary over time, so that the system is designed to reduce energy consumption when the workload permits. In addition, environmental conditions may also change allowing for better or worse cooling. As a result, various components have been introduced to provide differing amounts of power under different circumstance. In some examples, a power supply 140, which may be internal or external, is coupled to provide power to a Power Management Integrated Circuit (PMIC) 142 that supplies differing amounts of power over time to a core 132 of the processing system 108 through a voltage regulator 146 as the processor workload changes. The voltage regulator 146 is configured to maintain a particular voltage for the core 132. Increased power is provided by increasing the supplied current at a particular voltage.

A clock source 130, which may be external or internal, provides a clock signal 138 to the core 132 through a Dynamic Current and Voltage Scaling (DCVS) module 136. The DCVS module 136 may be coupled to one or more sensors and power control systems, such as a limits management system, to change the clock frequency and voltage that are supplied to the core 132. The core 132 can be throttled by throttling the supplied clock signal 138. The slower clock signal slows down an increase in the power demand of the core 132. A current sensor 104 may generate a current signal 103 to the limits management system or the DCVS module 136 to allow the DCVS module 136 to limit the peak current and sustained current in response to the sensed current. A current that peaks above a defined limit may cause permanent damage to a circuit or affect circuit performance. A sustained current that exceeds limits may cause overheating which eventually may cause damage to the PMIC 142, the voltage regulator 146, or the computing device 102 as a whole.

The current sensor 104 is electrically coupled to the power output 148 of the DCVS module 136 that powers the core 132 within the processing system 108. A voltage sensor 106 is also electrically coupled to the power output 148 to produce a voltage signal 107. The current sensor 104 is coupled to a current sensor controller 122 that also is coupled to the voltage sensor 106 to receive the voltage signal. A temperature sensor 134 is thermally coupled to the core 132 to produce a temperature signal 135 that is provided to the current sensor controller 122. The current sensor controller 122 is configured to calibrate the current sensor 104 in response to the voltage signal 107 and the temperature signal 135 as described below.

The current sensor controller 122 is coupled to a peak power controller 124 and sends a current signal 109 from the current sensor controller 122 to the peak power controller 124. The peak power controller 124 also receives a voltage signal 107 and other sensor data (not shown) for use in limiting the peak power of the core. The peak power controller may include a limits management system, a system power budget, and other components to make power decisions. The peak power controller 124 is coupled to the DCVS module 136 to control the scaling of the current and voltage within the DCVS module 136.

The peak power controller 124 monitors the signals from multiple sensors to track power consumption of the core 132. Data tracked by the peak power controller 124 may be updated and stored in a database so that historical power consumption levels may be used to accurately determine an available future current budget. The peak power controller 124 may generate throttling adjustments that are directed to the DCVS module 136 for application. By controlling throttling adjustments, current consumption may be maintained below a peak current threshold without unnecessarily reducing power consumption. The temperature sensor 134, current sensor 104 and voltage sensor 106 may also be coupled to other components (not shown) for other purposes.

The computing device 102 may be a single System on a Chip (SoC) coupled to other SoCs (not shown) within a package or in another package. The processing system 108 may include a second processing core and other cores which may include processing cores, system management cores, and other types of cores. The processing cores may be general purpose, video, signal processing, communications, transcoding, machine learning or any other type of processing core. Each processing core is powered by one or more power supplies 140. The power supplies 140 are an abstraction for the power provided to a respective processing core. More power supplies 140 may be used to suit particular processing cores. The particular configuration of processing core, processing system, power supplies, SoC, and computing device is provided as an example. The computing device 102 may have more and/or different components to suit different applications.

The present description is presented in the context of a voltage sensor 106 and a temperature sensor 134 coupled to a current sensor controller 122. The current sensor controller 122 is coupled to a peak power controller 124 to regulate a DCVS module 136. The current sensor controller 122 and peak power controller 124 may each include different functions and/or capabilities that may be unrelated to and/or in addition to the calibration trigger capability described herein. For example, additional functions and/or additional components may be provided to regulate the power to the core 132 and any additional cores and other components of the computing device 102. References herein to the current sensor controller 122 and the peak power controller 124 should be interpreted as including either simpler or more complex devices that perform the same calibration trigger and calibration functions. The connections between components described herein may also be modified or added to without changing the calibration trigger function. Some types of PMIC 142 monitor power rail status and report the status through, for example a power management bus (PMBus) (not shown). In some aspects, a current sensor is integrated into the PMIC 142 or into the core 132. Other types of control interfaces may be used instead of a PMBus.

The current sensor 104 may be in the form of a resistor and a voltage sensor to determine the actual current through the resistor to the power consumption device. The voltage across the resistor represents a measured current though the power output 148. The current signal 103 may be in the form of an analog voltage or an analog-to-digital converter may be used to convert the analog voltage to a numerical value that is received as the current signal 103. The resistor may be coupled to the power output 148 which may be in the form of power rails that are the output of the PMIC 142 as regulated by the voltage regulator 146 and DCVS module 136 or any other type of voltage regulator. Additional current sensors may be added to suit different processors and/or different power distribution networks. Similarly, the temperature signal 135 represents a measured temperature, measured by the temperature sensor 134 of the computing device. The voltage signal 107 represents a measured voltage of the computing device, e.g., at the power output 148. In some examples, the temperature sensor 134, the current sensor 104, and the voltage sensor 106 include one or more registers to store measured values. The measured values stored in the respective registers are provided as the temperature signal 135, current signal 103, and voltage signal 107, e.g., in response to a poll.

As shown, the computing device 102 includes the PMIC 142, the DCVS module 136, and the peak power controller 124. Any one or more of the components may be inside or outside of a SoC structure. Some components may be formed on a single die or formed on separate dies carried on a same or a second substrate apart from the processing system but within the same package. Some components may be mounted in separate packages with one or more Integrated Circuits (ICs) in the package. The PMIC and some associated components may be configured as a discrete IC on its own package substrate. The current sensor 104, voltage sensor 106, and other components may be included on an associated PMIC substrate or a different substrate. In some aspects, at least some of the sensors, including the temperature sensor, are implemented using discrete chiplets.

Figure 2:
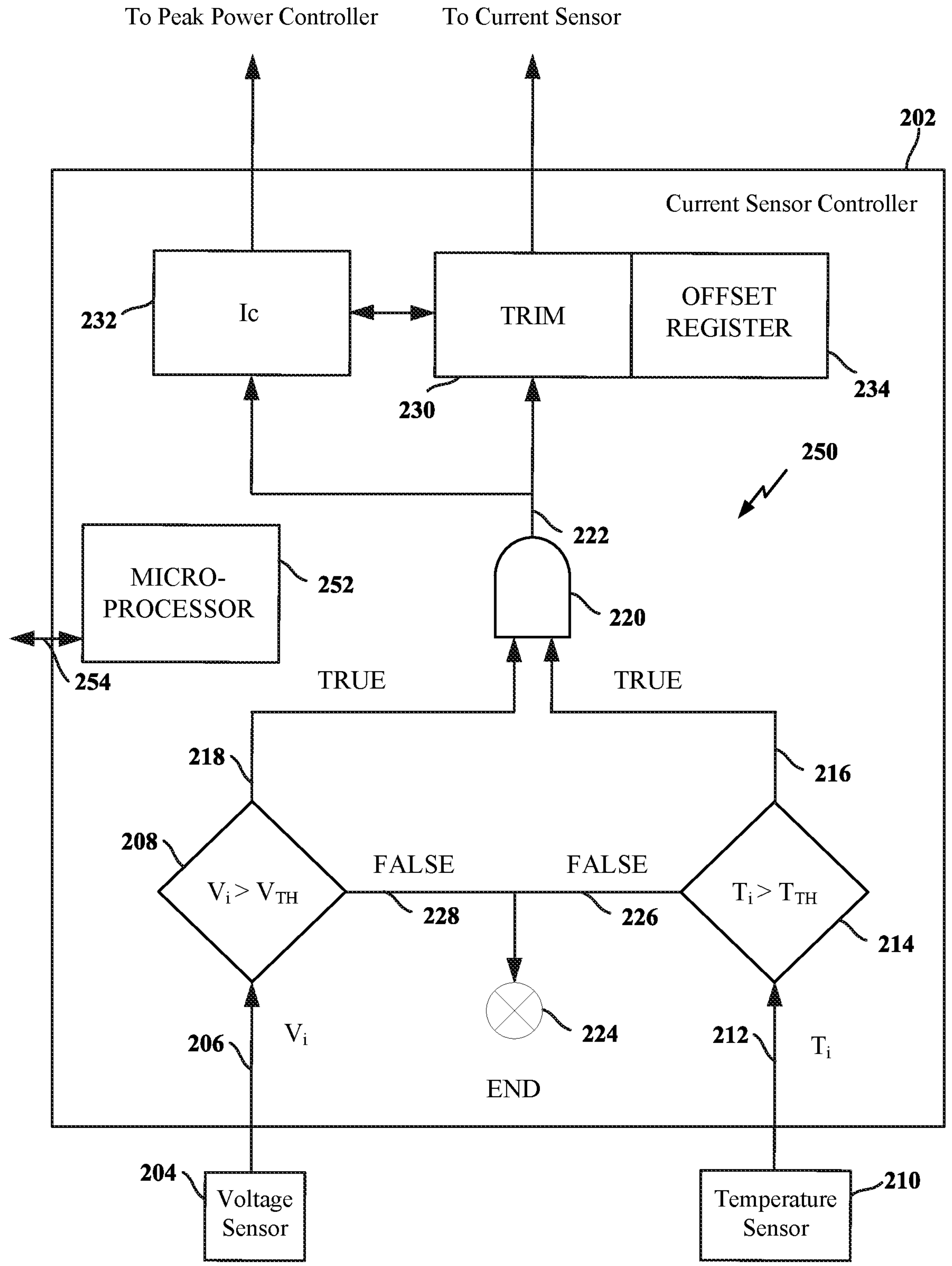
FIG. 2 illustrates a block diagram of a current sensor controller having a calibration trigger circuit, in accordance with certain aspects of the disclosure.

FIG. 2 is block diagram of a portion of a current sensor controller 202 having a calibration trigger circuit 250. A voltage sensor 204, e.g. the voltage sensor 106 of FIG. 1, or a different voltage sensor, measures a voltage related to a core of a processing system. The voltage sensor generates a voltage signal, $V_i$, on a voltage sideband connection 206 that is coupled to a voltage comparator 208. The voltage comparator 208 compares the voltage signal, $V_i$, to a voltage threshold $V_{TH}$, also referred to as a voltage cross-over point. The voltage comparator 208 determines if the voltage signal exceeds the voltage threshold. If the voltage signal exceeds the voltage threshold, then a voltage true signal 218 is generated. If the voltage does not exceed the threshold, then a voltage false signal 228 is generated.

Similarly, a temperature sensor 210, e.g., the temperature sensor 134 of FIG. 1, or a different temperature sensor, measures a temperature related to a core of a processing system. The temperature sensor generates a temperature signal, $T_i$, on a temperature sideband connection 212 that is coupled to a temperature comparator 214. The temperature comparator 214 compares the temperature signal, $T_i$, to a temperature threshold $T_{TH}$, also referred to as a temperature cross-over point. The temperature comparator determines if the temperature signal exceeds the temperature threshold. If the temperature signal exceeds the temperature threshold, then a temperature true signal 216 is generated. If the temperature does not exceed the threshold, then a temperature false signal 226 is generated. The thresholds may be set initially based on design criterion and may be modified over time to suit different computing device configurations and different operational circumstances. The thresholds are selected to trigger calibration when the core is operating above normal power but below a peak power.

The voltage false signal 228 and the temperature false signal 226 cause no result and are ended at a termination 224. The voltage true signal 218 and the temperature true signal 216 are coupled to a logic gate that receives the voltage true signal 218 and the temperature true signal 216 and generates a calibration trigger signal 222 in response. As shown, the logic gate 220 is an AND gate so that both the voltage true signal 218 and the temperature true signal 216 must both be high to generate the calibration trigger signal 222. In another example, the logic gate 220 is an OR gate so that the calibration trigger signal 222 is generated in response to either the voltage true signal 218 or the temperature true signal 216, or both. Alternatively, the logic gate 220 may have multiple inputs for multiple sensors or a cascade of logic gates for multiple sensors. The calibration trigger signal 222 is coupled to a trim circuit 230 to cause the trim circuit 230 to calibrate a current sensor, e.g., the current sensor 104 of FIG. 1, and to a current circuit 232 which provides a default current value, Ic, to the peak power controller during the calibration of the current sensor.

The calibration trigger signal 222 is generated by a calibration trigger circuit 250 that includes the logic gate 220, the comparators 208, 214. and their connections. The inputs to the calibration trigger circuit 250 are shown as a voltage sideband connection 206 and a temperature sideband connection 212. There may be more or fewer inputs and the input may not be a sideband connection but a main band connection including through a systems management bus. The output of the calibration trigger circuit 250 is the calibration trigger signal 222. The calibration trigger circuit 250 is shown as being integrated into the current sensor controller 202, however, it may be external to the current sensor controller 202 and be coupled to the current sensor controller 202 through a sideband connection between the calibration trigger circuit 250 output of the calibration trigger signal 222 and the trim circuit 230. In other examples, there may be other components between the calibration trigger signal 222 and the trim circuit 230.

The trim circuit may be coupled to multiple current sensors or the calibration trigger signal may be coupled to multiple trim circuits, or both. By generating a calibration trigger signal 222 in response to temperature and voltage cross-over points, the current sensor is calibrated when it is operating at higher temperatures and higher current values. When current sensor calibration is performed in response to a timer or startup event, then the core may be operating in a low power mode for which the peak power controller is typically inactive or not important. The sensor-based calibration may improve accuracy for the current sensor during the important operational conditions.

The voltage sensor 204 and the temperature sensor 210 may be configured in the form of hardware blocks that are coupled to the current sensor controller 202 through a voltage sideband connection 206 and a temperature sideband connection 212, respectively. The sideband connection may be coupled directly to the voltage and temperature sensors, respectively. The sideband connections may include wires or traces that are coupled to the current sensor controller 202 independent of a shared bus, a PMBus, or any software in the peak power controller or current sensor controller 202. When the sensors and the comparators are fabricated using hardware components, then the calibration trigger signal 222 may be generated more quickly. There is no need to wait for a software instruction in a current sensor controller or power controller to be called and executed. Alternatively, a management bus may be used such as a PMBus, Inter-Integrated Circuit (I2C) bus, or other type of system management bus. The comparators 208, 214 allow for configurable temperature and voltage thresholds as cross-over points for the calibration trigger signal 222 to the trim circuit 230.

The trim circuit calibrates the current sensor (not shown) using any suitable technique. The calibration corrects for the offset in the current signal from the current sensor that has been caused by environmental conditions and/or changes in the current sensor over time. During the calibration process, the normal operation of the current sensor is interrupted to allow for comparisons to trusted reference current values. The peak power controller and the DCVS module are not able to rely on the current sensor to control the power of the core. Accordingly, a static thermal mitigation may be applied. In some examples, the default current value, Ic, is transmitted from the current circuit 232 to the peak power controller during the calibration process to mitigate for any peak power events. The default current value, Ic, is a reduced current value to keep the core within safe operation. The default current value is selected to prevent any thermal or power overload at the core during the calibration. Since the default current value causes the core to operate at lower performance than may otherwise be possible, higher overall performance is achieved when the calibration is done quickly and less frequently.

After the calibration process by the trim circuit 230, an offset is stored at the current sensor controller 202 or at the current sensor 104 in an offset register 234. The stored offset from the offset register 234 is applied to the current sensor output and then to downstream circuitry, e.g., the peak power controller 124, for use in regulating the peak power, e.g., through the DCVS module 136. The stored sensor offset compensates for any offset in the current sensor output from the actual current.

The trim circuit 230 may be embodied as a finite state machine to avoid any delay caused by a software stack and to isolate the current sensor calibration from other operations. The trim circuit 230 may operate as an analog state machine in common mode. In examples, the trim circuit, applies a known current, measures the offset, and stores the offset in an offset register 234 for application to the output of the current sensor. In an example, an initial, one-time offset calibration sweeps over all the voltage combinations available at the core from the DCVS module. After the initial calibration, only a few steps above and below the current offset may be needed to obtain an accurate measurement of the offset. A small number of micro-steps above and below the current offset value allows for a quick calibration. With regular calibration, the impact of the temperature on the current sensor output will be similar over time and will only change gradually. Over time, as the current sensor and related circuitry ages, the offset may increase slowly and be corrected for slowly with successive calibrations.

The current sensor controller 202 may also include a microprocessor 252 coupled to an external bus 254 to communicate command, configuration, control, and data messages with other components of the computing device. The microprocessor may also regulate or control parameters and operations of the calibration trigger circuit 250. This may include configuring the cross-over points, including configuring the voltage threshold $V_{TH}$ and configuring the temperature threshold $T_{TH}$, and setting the default current, Ic. The microprocessor may also store values, measurements, and parameters of the current sensor controller 202, control states of the trim circuit 230, and otherwise regulate the operation of the calibration trigger circuit. In some examples, the trim circuit 230 is a part of the microprocessor. In some examples, the microprocessor is part of an external component.

Figure 3:
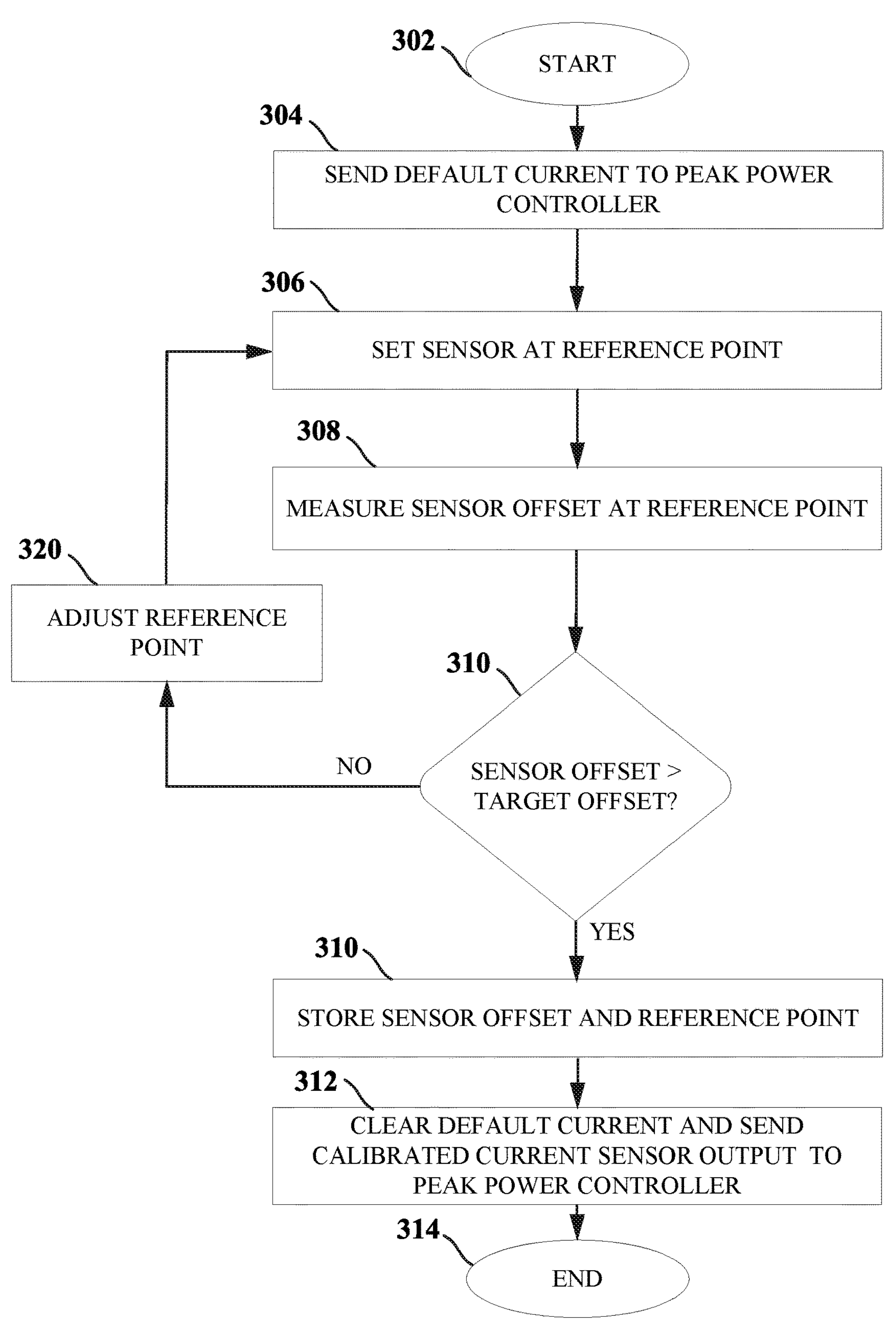
FIG. 3 illustrates a flow diagram of the operation of an example trim circuit to perform a current sensor calibration, in accordance with certain aspects of the disclosure.

FIG. 3 is a process flow diagram of the operation of an example trim circuit 230 to perform a current sensor calibration. Other trim circuits and other processes may be used to calibrate the current sensor output. At 302, the process starts. Before this time, the trim circuit is in a wait or standby state. Alternatively, the trim circuit is in another state performing other tasks, not shown.

The trim circuit then enters an initialization state. In the initialization state, the current sensor controller clears the calibrated current sensor output and sends the default current, Ic, to the peak power controller at 304. The default current ensures that the core does not operate outside of a safe range.

The trim circuit, then enters a calibration state. The current sensor is set to a reference point at 306. The sensor reference point configures the current sensor for measurement. At 308, the trim circuit receives the current sensor output response to the reference point. The offset from the reference point is determined and assessed at 310. If the offset between the current sensor output at the reference point and the target current sensor output is greater than a target offset, then at 310, the new sensor offset is stored in an offset register with the reference point as the new current sensor calibration. If the sensor offset is greater than the target offset, then the front end is adjusted to a new reference point at 320. The process returns to set the sensor to a new reference point 306. The sensor offset is measured at the new reference point 308 and the newly measured sensor offset is compared to the target offset at 310. The process continues to adjust the reference point until an acceptably accurate sensor offset is obtained.

After the calibration state, the trim circuit then moves to a standby state and the computing device moves to normal operation. In the standby state, the new sensor offset has been stored. The current sensor controller clears the default current and sends the calibrated current sensor output to the peak power controller and any other power management system, depending on the configuration of the computing device. The calibrated current sensor output is a current output that is adjusted for the measured offset at 308.

Figure 4:
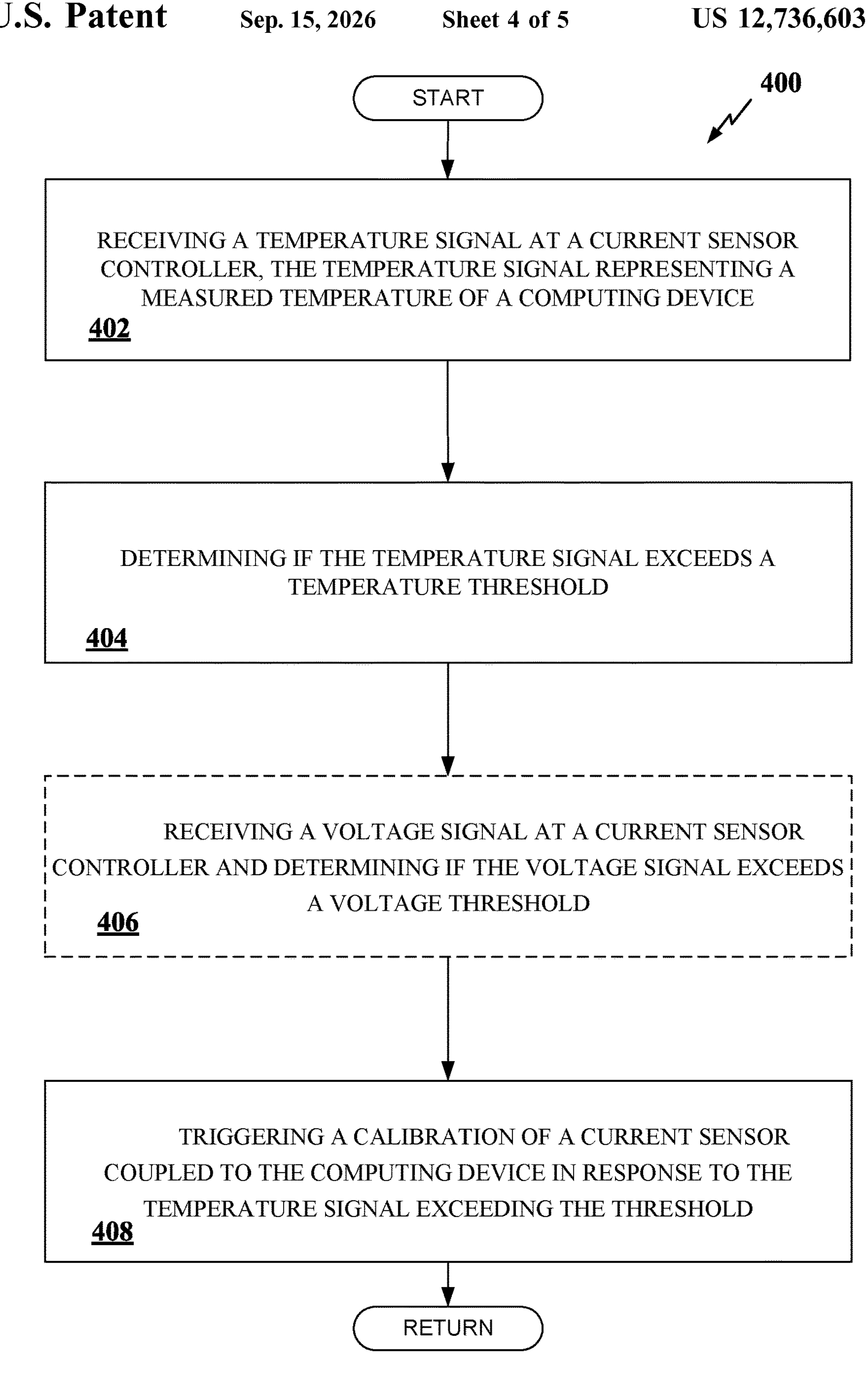
FIG. 4 illustrates a flow diagram of the operation of a calibration trigger circuit, in accordance with certain aspects of the disclosure.

FIG. 4 is a process flow diagram 400 of the operation of a calibration trigger circuit, for example, the calibration trigger circuit 250 of FIG. 2. In some examples, the process flow may be executed by the microprocessor 252 of FIG. 2 or by a processor within the current sensor controller 122 or another component of the computing device 102 of FIG. 1 using software instead of by the calibration trigger circuit 250. The process begins at 402 with receiving a temperature signal at a current sensor controller, the temperature signal representing a measured temperature of a computing device. The temperature signal may be received from a temperature sensor hardware block and may include receiving the temperature signal through a first sideband interface.

At 404, the process continues with determining if the temperature signal exceeds a temperature threshold. In some examples, this includes generating a temperature true signal by a comparator in response to the temperature signal exceeding a temperature threshold. The temperature true signal may be generated by a comparator. At 408 the process continues with triggering a calibration of a current sensor coupled to the computing device in response the temperature exceeding the temperature threshold. In some examples a logic gate receives the temperature true signal and generates a calibration trigger signal in response to the temperature true signal.

In some examples an optional operation is performed of receiving a voltage signal at a current sensor controller, the voltage signal representing a measured current of the computing device and determining if the voltage signal exceeds a voltage threshold at 406. In some examples, a comparator generates a voltage true signal in response to the voltage signal exceeding a voltage threshold. The voltage signal may be received from a voltage sensor hardware block coupled to the current sensor controller through a second sideband interface. The last operation at 408 may include triggering a calibration of a current sensor coupled to the computing device in response to the temperature signal exceeding the temperature threshold and the voltage signal exceeding the voltage threshold. In some examples, the temperature comparator and the voltage comparator are coupled to a logic gate that generates a calibration trigger signal in response to a temperature true signal and a voltage true signal. In some examples, the logic gate is an AND gate. The calibration trigger signal may be coupled to a trim circuit to calibrate the current sensor in response to the calibration trigger signal.

Figure 5:
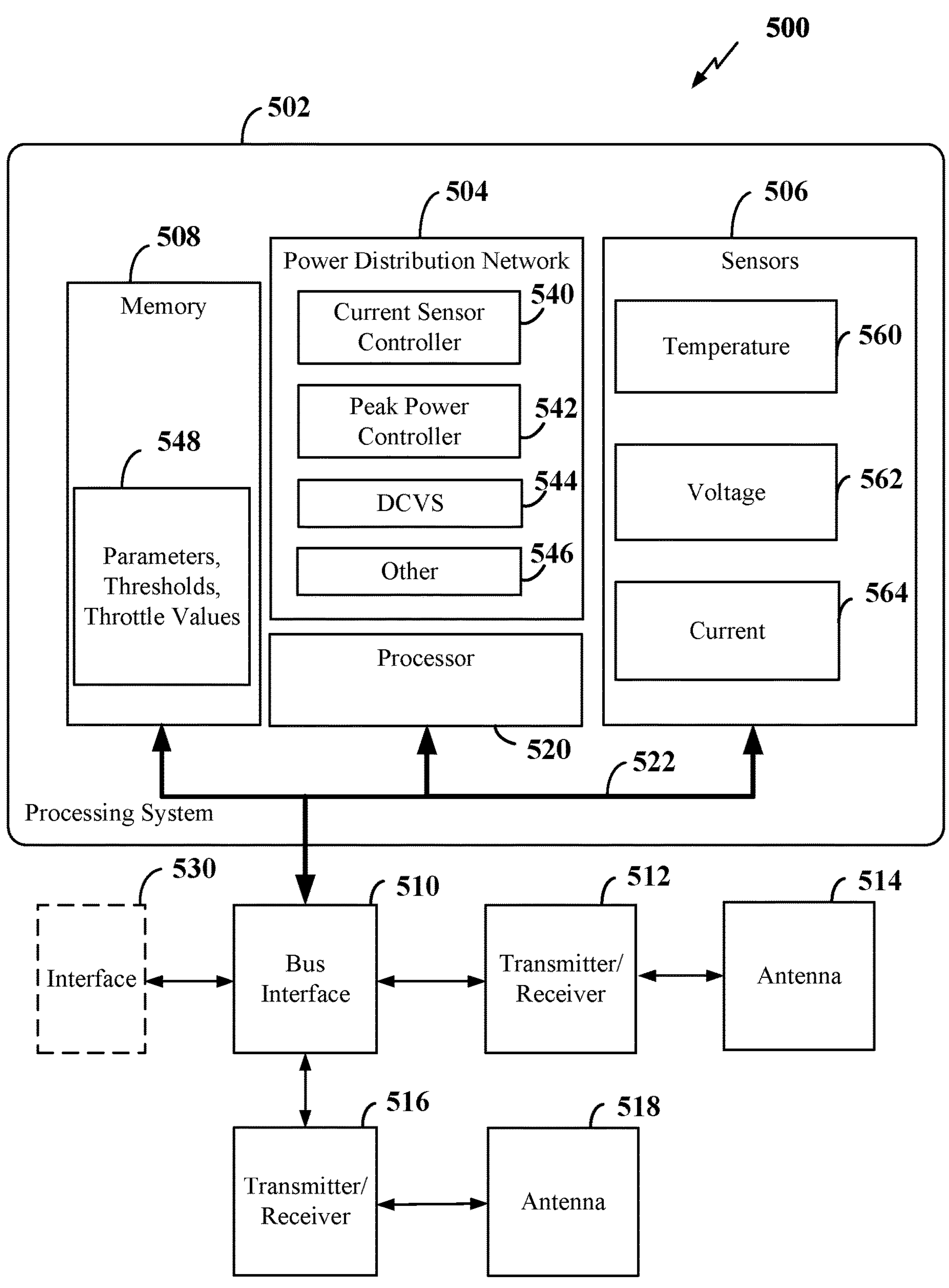
FIG. 5 illustrates a block diagram of an example hardware implementation of a computing device with current sensor calibration, in accordance with certain aspects of the disclosure.

FIG. 5 illustrates a block diagram of an example of a hardware implementation for a computing device 500, such as a user equipment, a portable device, a notebook computer, a tablet, a computer, a server, a router, a memory array, or any other suitable device with one or more integrated cores with calibrated current sensors. In this example, a processing system 502 has a processor 520 with one or more processor cores as described above. In accordance with various aspects of the disclosure, an element, or any portion of an element, or any combination of elements may be implemented with the processing system 502. The processing system 502 may include one or more processors 520. Examples of processors 520 include microprocessors, microcontrollers, digital signal processors (DSPs), field programmable gate arrays (FPGAs), programmable logic devices (PLDs), state machines, gated logic, discrete hardware circuits, and other suitable hardware configured to be controlled by a clocking frequency and a voltage as described throughout this disclosure. In various examples, the computing device 500 may be configured to perform any one or more of the functions described herein.

In this example, the processing system 502 may be implemented with a bus architecture, represented generally by the bus 522. The bus 522 may include any number of interconnecting buses and bridges depending on the specific application of the processing system 502 and the overall design constraints. The bus 522 communicatively couples together various circuits including one or more processors (represented generally by the processor 520), a power distribution network 504, a memory 508, and sensors (represented generally by the sensors 506) coupled to various parts of the processing system 502 to measure operating parameters. The bus 522 may also link various other circuits such as timing sources, peripherals, voltage regulators, and power management circuits, which are well known in the art, and therefore, will not be described any further. A bus interface 510 provides an interface between the bus 522 and a primary radio shown as a first transmitter/receiver 512 or transceiver and a first at least one antenna 514 and between the bus 522 and an interface 530. The first transmitter/receiver 512 provides a communication interface or means for communicating through the first at least one antenna 514 with various other apparatus over a wireless transmission medium.

The bus interface 510 also provides an interface between the bus 522 and a secondary radio shown as a second transmitter/receiver 516 and a second at least one antenna 518. In some examples, the wireless device may include two or more transceivers, each configured to communicate with a respective network type (for example, terrestrial or non-terrestrial) through the same or different antennas. The interface 530 provides a communication interface or means of communicating with various other apparatuses and devices (for example, other devices housed within the same apparatus or other external apparatus) over an internal bus or external transmission medium, such as an Ethernet cable. Depending upon the nature of the apparatus, the interface 530 may include a user interface (for example, keypad, display, speaker, microphone, joystick). Of course, such a user interface is optional, and may be omitted in some examples, such as an Internet of Things (IoT) device.

The processor 520 is responsible for managing the bus 522 and general processing, including the execution of software stored in memory 508. The software, when executed by the processor 520, causes the processing system 502 to perform the various functions for any particular apparatus. The memory 508 may also be used for storing data that is manipulated by the processor 520 when executing software and may have registers 548 for parameters, thresholds, default currents, and offsets.

The power distribution network 504 may be a part of one or more processor cores of the processor 520 or an uncore and perform some operations by means of a processor core executing software stored in memory 508, or the power distribution network 504 may be independent of the processor 520 within the processing system 502 to perform operations using its own processing resources and hardware. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The power distribution network 504 performs operations performed by the current sensor controller of FIG. 2, including the calibration trigger circuit 250 and the power components of FIG. 1.

The computing device 500 may be configured to perform any one or more of the operations described herein. In some aspects of the disclosure, the power distribution network 504, as utilized in the computing device 500, may include circuitry configured for various functions. The power distribution network 504 includes at least a current sensor controller 540 with a calibration trigger circuit, a peak power controller 542, a DCVS module 544 and other components 546, such as a PMIC, a voltage regulator, limits management, etc. The power distribution network 504 is coupled to the memory 508 through the bus 522. The memory 508 includes registers 548 that may include parameters, thresholds, default currents, offsets, etc. for various different power modes of the cores as may be implemented by a DCVS and the peak power controller as described above.

The power distribution network 504 is further coupled to sensors 506 including a temperature sensor 560, a voltage sensor 562, and a current sensor 564 to generate a calibration trigger signal to calibrate the current sensor 564. The sensors 506 may include one or more hardware components that provide the physical structure that performs various processes measurements related to sensing the temperature, voltage or current. The power distribution network 504 may also contain one or more hardware components to generate a calibration trigger signal and to calibrate the current sensor 564.

The circuit architecture described herein may be implemented on one or more ICs, analog ICs. RFICs, mixed-signal ICs, ASICs, printed circuit boards (PCBs), electronic devices, etc. The circuit architecture described herein may also be fabricated with various process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuits described herein may be a stand-alone device or may be part of a larger device. A device may be (i) a stand-alone IC, (ii) a set of one or more ICs that may include memory ICs for storing data and/or instructions, (iii) a radio frequency integrated circuit (RFIC) such as an RF receiver (RFR) or an RF transmitter/receiver (RTR), (iv) ASICs such as a mobile station modem (MSM), (v) a module that may be embedded within other devices, (vi) a receiver, cellular phone, wireless device, handset, or mobile unit, (vii) etc.

As used herein, “or” is intended to be interpreted in the inclusive sense, unless otherwise explicitly indicated. For example, “a or b” may include a only, b only, or a combination of a and b. As used herein, a phrase referring to “at least one of” or “one or more of” a list of items refers to any combination of those items, including single members. For example, “at least one of: a, b, or c” is intended to cover the examples of: a only, b only, c only, a combination of a and b, a combination of a and c, a combination of b and c, and a combination of a and b and c.

The various illustrative components, logic, logical blocks, modules, circuits, operations, and algorithm processes described in connection with the implementations disclosed herein may be implemented as electronic hardware, firmware, software, or combinations of hardware, firmware, or software, including the structures disclosed in this specification and the structural equivalents thereof. The interchangeability of hardware, firmware and software has been described generally, in terms of functionality, and illustrated in the various illustrative components, blocks, modules, circuits and processes described above. Whether such functionality is implemented in hardware, firmware or software depends upon the particular application and design constraints imposed on the overall system.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, for example, a combination of a DSP and a processor, a plurality of processors, one or more processors in conjunction with a DSP core, or any other such configuration.

In one or more exemplary aspects, the functions described may be implemented in hardware, software, firmware, or any combination thereof. If implemented in software, the functions may be stored as one or more instructions or code stored on a computer-readable medium.

Various modifications to the implementations described in this disclosure may be readily apparent to persons having ordinary skill in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, various features that are described in this specification in the context of separate implementations also can be implemented in combination in a single implementation. Conversely, various features that are described in the context of a single implementation also can be implemented in multiple implementations separately or in any suitable subcombination. As such, although features may be described above as acting in particular combinations, and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flowchart or flow diagram. However, other operations that are not depicted can be incorporated in the example processes that are schematically illustrated. For example, one or more additional operations can be performed before, after, simultaneously, or between any of the illustrated operations. In some circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The following provides an overview of examples of the present disclosure.

Example 1: An apparatus comprising: a current sensor controller configured to receive a temperature signal representing a measured temperature of a computing device, a comparator configured to determine if the temperature signal exceeds a temperature threshold; and a logic gate configured to trigger a calibration of a current sensor coupled to the computing device in response to the temperature signal exceeding the temperature threshold.

Example 2. The apparatus of example 1, further comprising a temperature sensor hardware block and wherein the current sensor controller is further configured to receive the temperature signal from the temperature sensor hardware block.

Example 3: The apparatus of any of the above examples, further comprising a first sideband interface to carry the temperature signal to the current sensor controller.

Example 4: The apparatus of any of the above examples, wherein the comparator comprises a first hardware comparator, the first hardware comparator generating the temperature true signal if the temperature signal exceeds the temperature threshold.

Example 5: The apparatus of any of the above examples, wherein the current sensor controller is configured to receive a voltage signal representing a measured voltage of the computing device; and a second comparator configured to determine if the voltage signal exceeds a voltage threshold, wherein the logic gate is further configured to trigger a calibration of the current sensor in response to the temperature signal and the voltage signal.

Example 6: The apparatus of any of the above examples, further comprising a voltage sensor hardware block and wherein the current sensor controller is further configured to receive the voltage signal from the voltage sensor hardware block.

Example 7: The apparatus of example 5, further comprising a second sideband interface to carry the voltage signal to the current sensor controller.

Example 8: The apparatus of example 5 of 6, further comprising a processor configured to: configure the temperature threshold; and configure the voltage threshold.

Example 9: The apparatus of any of the above examples, wherein the logic gate is further configured to trigger the calibration in response to both the temperature signal exceeding the temperature threshold and the voltage signal exceeding the voltage threshold.

Example 10: The apparatus of any of the above examples, further comprising a finite state machine configured to calibrate the current sensor and coupled to the logic gate wherein the logic gate triggers the calibration by generating a calibration trigger signal, and wherein the finite state machine calibrates the current sensor in response to the calibration trigger signal.

Example 11 The apparatus of example 10, further comprising a default current circuit and wherein the default current circuit is configured to apply a default current to a peak power controller of a computing device during the calibration of the current sensor.

Example 12: The apparatus of example 10 or 11, wherein the finite state machine is configured to calibrate the current sensor by: setting the current sensor to a reference point; measuring an output of the current sensor at the reference point; determining an offset between the reference point and the output; and storing a representation of the offset in an offset register.

Example 13: The apparatus of example 12, wherein the finite state machine determines the offset by adjusting the reference point until the offset is less than a target offset.

Example 14: A method, comprising: receiving a temperature signal at a current sensor controller, the temperature signal representing a measured temperature of a computing device; determining if the temperature signal exceeds a temperature threshold; and triggering a calibration of a current sensor coupled to the computing device in response to the temperature signal exceeding the temperature threshold.

Example 15: The method of example 14, wherein the receiving the temperature signal comprises receiving the temperature signal from a temperature sensor hardware block.

Example 16: The method of example 14, wherein the receiving the temperature signal comprises receiving the temperature signal through a first sideband interface.

Example 17: The method of any of examples 14 or 15, further comprising: receiving the temperature signal at a first hardware comparator, the first hardware comparator generating the temperature true signal.

Example 18: The method of any of examples 14 to 16, further comprising: receiving a voltage signal at a current sensor controller, the voltage signal representing a measured voltage of the computing device; and determining if the voltage signal exceeds a voltage threshold, wherein the triggering the calibration comprises triggering the calibration of the current sensor in response to the temperature signal and the voltage signal.

Example 19: The method of example 18, wherein the receiving the voltage signal comprises receiving the voltage signal from a voltage sensor hardware block.

Example 20: The method of example 18 or 19, wherein the receiving the voltage signal comprises receiving the voltage signal through a second sideband interface.

Example 21: The method of any of examples 18 to 20, further comprising: configuring the temperature threshold; and configuring the voltage threshold.

Example 22: The method of any of examples 14 to 21, further comprising calibrating the current sensor in response to the triggering the calibration by: setting the current sensor to a reference point; measuring an output of the current sensor at the reference point; determining an offset between the reference point and the output; and storing a representation of the offset in an offset register.

Example 23: The method of example 22, wherein the determining the offset comprises adjusting the reference point until the offset is less than a target offset.

Example 24: An apparatus comprising: means for receiving a temperature signal at a current sensor controller, the temperature signal representing a measured temperature of a computing device; means for determining if the temperature signal exceeds a temperature threshold; and means for triggering a calibration of a current sensor coupled to the computing device in response to the temperature signal exceeding the temperature threshold.

Example 25: The apparatus of example 24, further comprising means coupled to the means for triggering the calibration for calibrating the current sensor.

What is claimed is:

1. An apparatus comprising:

a current sensor controller configured to receive a temperature signal representing a measured temperature of a computing device and a voltage signal representing a measured voltage of the computing device;

a logic gate configured to trigger a calibration of a current sensor coupled to the computing device in response to the temperature signal exceeding a temperature threshold and the voltage signal exceeding a voltage threshold; and a finite state machine configured to calibrate the current sensor and coupled to the logic gate wherein the logic gate triggers the calibration by generating a calibration trigger signal, and wherein the finite state machine calibrates the current sensor in response to the calibration trigger signal.

2. The apparatus of claim 1, further comprising a temperature sensor hardware block and wherein the current sensor controller is further configured to receive the temperature signal from the temperature sensor hardware block.

3. The apparatus of claim 1, further comprising a first sideband interface to carry the temperature signal to the current sensor controller.

4. The apparatus of claim 1, further comprising a comparator configured to compare the temperature signal with the temperature threshold.

5. The apparatus of claim 1, further comprising a voltage sensor hardware block and wherein the current sensor controller is further configured to receive the voltage signal from the voltage sensor hardware block.

6. The apparatus of claim 1, further comprising a second sideband interface to carry the voltage signal to the current sensor controller.

7. The apparatus of claim 1, further comprising a processor configured to configure the temperature threshold.

8. The apparatus of claim 1, further comprising a default current circuit and wherein the default current circuit is configured to apply a default current to a peak power controller of a computing device during the calibration of the current sensor.

9. The apparatus of claim 1, wherein the finite state machine is configured to calibrate the current sensor by:
setting the current sensor to a reference point;
measuring an output of the current sensor at the reference point;
determining an offset between the reference point and the output; and
storing a representation of the offset in an offset register.

10. The apparatus of claim 9, wherein the finite state machine determines the offset by adjusting the reference point until the offset is less than a target offset.

11. A method, comprising:
receiving a temperature signal and a voltage signal at a current sensor controller, the temperature signal representing a measured temperature of a computing device, the voltage signal representing a measured voltage of the computing device; and
triggering, using a logic gate, a calibration of a current sensor coupled to the computing device in response to the temperature signal exceeding a temperature threshold and the voltage signal exceeding a voltage threshold, wherein a finite state machine is configured to calibrate the current sensor in response to a calibration trigger signal.

12. The method of claim 11, wherein the receiving the temperature signal comprises receiving the temperature signal from a temperature sensor hardware block.

13. The method of claim 11, wherein the receiving the temperature signal comprises receiving the temperature signal through a first sideband interface.

14. The method of claim 11, further comprising:
receiving the temperature signal at a first hardware comparator, the first hardware comparator generating a temperature true signal in response to the temperature signal exceeding the temperature threshold.

15. The method of claim 11, wherein the receiving the voltage signal comprises receiving the voltage signal from a voltage sensor hardware block.

16. The method of claim 11, wherein the receiving the voltage signal comprises receiving the voltage signal through a second sideband interface.

17. The method of claim 11, further comprising
configuring the temperature threshold.

18. The method of claim 11, further comprising calibrating the current sensor in response to the triggering the calibration by:
setting the current sensor to a reference point;
measuring an output of the current sensor at the reference point;
determining an offset between the reference point and the output; and
storing a representation of the offset in an offset register.

19. The method of claim 18, wherein the determining the offset comprises adjusting the reference point until the offset is less than a target offset.

20. The method of claim 11, further comprising:
generating a temperature true signal in response to the temperature signal exceeding a temperature threshold;
generating a voltage true signal in response to the voltage signal exceeding a voltage threshold; and
triggering the calibration of the current sensor based on the temperature true signal and the voltage true signal.

21. An apparatus comprising:
means for receiving a temperature signal and a voltage signal at a current sensor controller, the temperature signal representing a measured temperature of a computing device, the voltage signal representing a measured voltage of the computing device;
a logic gate configured to trigger a calibration of a current sensor coupled to the computing device in response to the temperature signal exceeding a temperature threshold and the voltage signal exceeding a voltage threshold; and
a finite state machine configured to calibrate the current sensor in response to a calibration trigger signal.

22. The apparatus of claim 21, further comprising means for calibrating the current sensor, wherein the means for calibrating the current sensor is coupled to the logic gate configured to trigger the calibration.

23. The apparatus of claim 21, further comprising: means for generating a temperature true signal in response to the temperature signal exceeding a temperature threshold; means for generating a voltage true signal in response to the voltage signal exceeding a voltage threshold;
and wherein the logic gate is further configured to trigger the calibration of the current sensor coupled to the computing device based on the temperature true signal and the voltage true signal.

* * * * *